United States Patent
Hoshi et al.

(10) Patent No.: US 9,384,999 B2
(45) Date of Patent: Jul. 5, 2016

(54) PLASMA ETCHING METHOD AND STORAGE MEDIUM

(75) Inventors: Naotsugu Hoshi, Portland, OR (US); Noriyuki Kobayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1143 days.

(21) Appl. No.: 12/254,943

(22) Filed: Oct. 21, 2008

(65) Prior Publication Data
US 2009/0111275 A1    Apr. 30, 2009

Related U.S. Application Data

(60) Provisional application No. 61/024,387, filed on Jan. 29, 2008.

(30) Foreign Application Priority Data

Oct. 24, 2007    (JP) .................. 2007-276500

(51) Int. Cl.
| | |
|---|---|
| *H01L 21/3065* | (2006.01) |
| *H01L 21/311* | (2006.01) |
| *H01J 37/32* | (2006.01) |
| *H01L 21/768* | (2006.01) |

(52) U.S. Cl.
CPC ..... *H01L 21/31138* (2013.01); *H01J 37/32091* (2013.01); *H01L 21/31116* (2013.01); *H01L 21/31144* (2013.01); *H01L 21/76802* (2013.01); *H01L 21/76834* (2013.01)

(58) Field of Classification Search
CPC .......... H01L 21/31138; H01L 21/31116; H01J 37/32091
USPC .................... 438/710; 257/E21.218
See application file for complete search history.

(56) References Cited

U.S. PATENT DOCUMENTS

| | | | | |
|---|---|---|---|---|
| 6,046,115 | A  * | 4/2000 | Molloy et al. | 438/710 |
| 2004/0209468 | A1 * | 10/2004 | Kumar et al. | 438/689 |
| 2005/0079706 | A1 * | 4/2005 | Kumar et al. | 438/638 |
| 2006/0019491 | A1 * | 1/2006 | Soda | 438/638 |
| 2010/0225003 | A1 * | 9/2010 | Lagha et al. | 257/774 |

FOREIGN PATENT DOCUMENTS

| | | |
|---|---|---|
| JP | 2002-110644 | 4/2002 |
| JP | 2005-5697 | 1/2005 |
| JP | 2006-270019 | 10/2006 |

* cited by examiner

*Primary Examiner* — Duy Deo
*Assistant Examiner* — Mahmoud Dahimene
(74) *Attorney, Agent, or Firm* — Oblon, McClelland, Maier & Neustadt, L.L.P.

(57) ABSTRACT

A plasma etching method that can prevent residues from becoming attached to bottoms and sides of via holes and trenches. An interlayer insulation film formed of $C_wF_x$ (x and w are predetermined natural numbers) and a metallic layer or a metal-containing layer formed on a substrate are exposed at the same time to plasma generated from a process gas. The process gas is a mixed gas including $C_yF_z$ (y and z are predetermined natural numbers) gas and $N_2$ gas, and the flow rate of the $N_2$ gas in the process gas is higher than the flow rate of the $C_yF_z$ gas.

6 Claims, 5 Drawing Sheets

PLASMA ETCHING METHOD AND STORAGE MEDIUM

BACKGROUND OF THE INVENTION

1. Field of the Invention

The present invention relates to a plasma etching method and a storage medium, and more particularly to an plasma etching method in which a $C_wF_x$ (x and y are predetermined natural numbers)-based low-dielectric interlayer insulation film and a metallic layer or a metal-containing layer are exposed to plasma at the same time.

2. Description of the Related Art

In recent years, in a semiconductor device manufactured from a semiconductor wafer through a CVD process, plasma etching, or the like, a low-dielectric interlayer insulation film is used so as to lower parasitic capacitance due to insulation films between wires, and also, copper wiring is used so as to lower wiring resistance. In particular, as a low-dielectric interlayer insulation film, for example, a porous $SiO_2$ film, SiOC film, or SOG (Spin on Glass) film (for example, a film formed of hydrogen silsesquioxane (HSQ) or methyl silsesquioxane (MSQ)) is used.

An SiC layer, an SiCN layer, and so on are formed as an etching stopper layer on copper wiring so as to prevent inadvertent etching of the copper wiring. When a via hole that reaches the copper wiring is to be formed, these layers such as the SiC layer are removed by etching. In etching of an SiC layer or the like, plasma generated from a single gas of a fluorine compound or a mixed gas of a fluorine compound gas (for example, $CF_4$ gas or $CH_2F_2$ gas) and $N_2$ gas has been conventionally used. Here, if the mixed gas is used, the flow rate of the $N_2$ gas is set to be lower than the flow rate of the fluorine compound gas (see e.g. Japanese Laid-Open Patent Publication (Kokai) No. 2002-110644).

An SOG film is a film that is formed by coating a fluid material and ensures a low dielectric constant by increasing porosity, and therefore, the SOG film has the problem of having a low mechanical strength. Thus, in recent years, it has been considered that a $C_wF_x$-based organic film is used as a low-dielectric interlayer insulation film having a high mechanical strength.

However, the inventors of the present invention and others etched an SiCN layer using plasma generated from a mixed gas of $CF_4$ gas and $N_2$ gas in a semiconductor wafer having a $C_wF_x$-based interlayer insulation film, an SiCN layer, and copper wiring before putting a $C_wF_x$-based organic film to practical use, and found that, after the SiCN layer was removed to expose the copper wiring through the etching, residues became attached to bottoms and sides of via holes reaching the copper wiring and trenches formed in an interlayer insulation film. These residues cause short-circuiting and capacitance change in a semiconductor device, and thus have to be prevented from being produced.

SUMMARY OF THE INVENTION

The present invention provides a plasma etching method and a storage medium that can prevent residues from becoming attached to bottoms and sides of via holes and trenches.

Accordingly, in a first aspect of the present invention, there is provided a plasma etching method in which an interlayer insulation film formed of $C_wF_x$ (x and w are predetermined natural numbers) and a metallic layer or a metal-containing layer formed on a substrate are exposed at the same time to plasma generated from a process gas, wherein the process gas is a mixed gas including $C_yF_z$ (y and z are predetermined natural numbers) gas and $N_2$ gas, and a flow rate of the $N_2$ gas in the process gas is higher than a flow rate of the $C_yF_z$ gas.

According to the first aspect of the present invention, the flow rate of $N_2$ gas in the process gas containing $C_yF_z$ gas and $N_2$ gas is higher than the flow rate of $C_yF_z$ gas. Residues are comprised of reaction product of metal dispersing from the metallic layer or the metal-containing layer and C (carbon) dispersing from the interlayer insulation film, and plasma generated from $N_2$ gas sputters the reaction product to decompose the reaction product. However, because the flow rate of $N_2$ gas is higher than the flow rate of $C_yF_z$ gas, plasma generated from $N_2$ gas increases, which facilitates sputtering and decomposition of residues resulting from the reaction product. Therefore, residues can be prevented from becoming attached to bottoms and sides of via holes and trenches.

The first aspect of the present invention can provide a plasma etching method, wherein in the process gas, a ratio of the flow rate of the $C_yF_z$ gas and the flow rate of the $N_2$ gas is expressed by the following equation, $C_yF_z$ gas:$N_2$ gas=1:X (where X≥7).

According to the first aspect of the present invention, because the ratio of the flow rate of $C_yF_z$ gas and the flow rate of $N_2$ gas in the process gas is expressed by the following equation, $C_yF_z$ gas:$N_2$ gas=1:X (where X≥7), the flow rate of $N_2$ gas in the process gas is high. Therefore, sputtering and decomposition of the residues can be more facilitated, so that the residues can be reliably prevented from becoming attached to the bottoms and sides of the via holes and the trenches.

The first aspect of the present invention can provide a plasma etching method, wherein the metallic layer is formed of copper, and the metallic layer is covered by an etching stop layer formed under the interlayer insulation film.

According to the first aspect of the present invention, because the metallic layer formed of copper is covered by the etching stop layer formed under the interlayer insulation film, the metallic layer can be prevented from being inadvertently etched when the interlayer insulation film is etched. Moreover, even if the etching stop layer is removed, and copper flies apart from the metallic layer, the residues can be reliably prevented from becoming attached to the bottoms and sides of the via holes and the trenches by applying the present invention.

The first aspect of the present invention can provide a plasma etching method, wherein the etching stop layer is an SiC layer or an SiCN layer.

According to the first aspect of the present invention, because the etching stop layer is an SiC layer or an SiCN layer, the etching stop layer can be etched by plasma generated from $C_yF_z$ gas in the process gas, and the via holes penetrating through the etching stop layer can be reliably formed.

The first aspect of the present invention can provide a plasma etching method, wherein the metal-containing layer is a hard mask formed in a predetermined pattern on the interlayer insulation film.

According to the first aspect of the present invention, the metal-containing layer is a hard mask formed in a predetermined pattern on the interlayer insulation film, but even if metal flies apart from the hard mask during etching of the interlayer insulating film via the hard mask, the residues can be reliably prevented from becoming attached to the bottoms and sides of the via holes and the trenches by applying the present invention.

Accordingly, the second aspect of the present invention can provide a computer-readable storage medium storing a program for causing a computer to implement a plasma etching method in which an interlayer insulation film formed of $C_wF_x$ (x and w are predetermined natural numbers) and a metallic layer or a metal-containing layer formed on a substrate are exposed at the same time to plasma generated from a process gas, wherein the process gas is a mixed gas including $C_yF_z$ (y and z are predetermined natural numbers) gas and $N_2$ gas, and a flow rate of the $N_2$ gas in the process gas is higher than a flow rate of the $C_yF_z$ gas.

The features and advantages of the invention will become more apparent from the following detailed description taken in conjunction with the accompanying drawings.

BRIEF DESCRIPTION OF THE DRAWINGS

FIGS. 2A and 2B are schematic views of the construction of a semiconductor device formed on a wafer, to which is applied the plasma etching method according to the present embodiment, in which

DETAILED DESCRIPTION OF THE PREFERRED EMBODIMENTS

Preferred embodiments of the present invention will be described in detail below with reference to the drawings.

First, a description will be given of a plasma etching method according to a first embodiment of the present invention.

Figure 1:
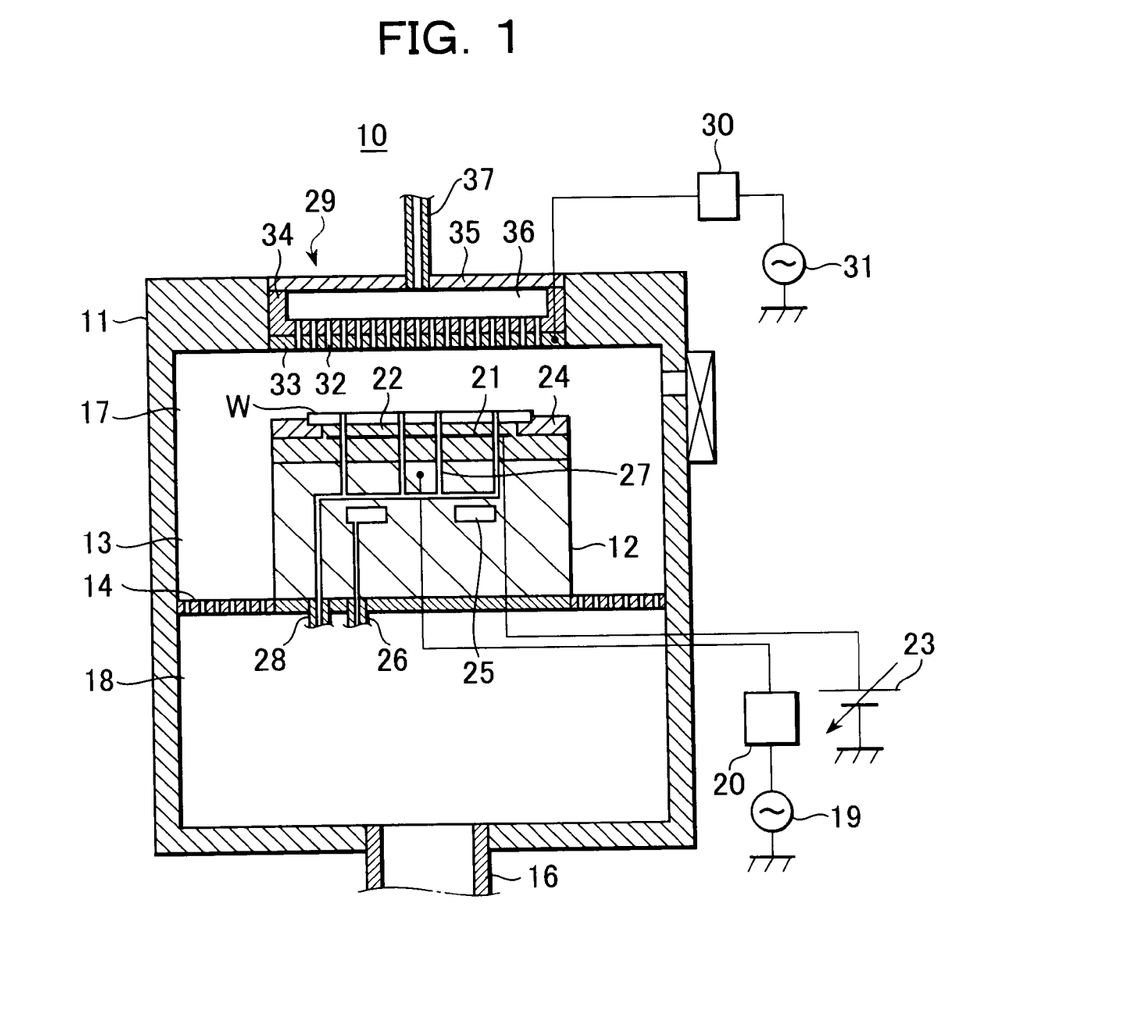
FIG. 1 is a schematic cross-sectional view showing the construction of a substrate processing apparatus that executes a plasma etching method according to a first embodiment of the present invention.

FIG. 1 is a schematic cross-sectional view showing the construction of a substrate processing apparatus that executes the plasma etching method according to the present embodiment. The substrate processing apparatus is constructed such as to carry out plasma etching on a semiconductor wafer as a substrate.

Referring to FIG. 1, the substrate processing apparatus 10 has a chamber 11 that accommodates a semiconductor wafer (hereinafter simply referred to as "the wafer") W having a diameter of e.g. 300 mm, and a cylindrical susceptor 12 on which the wafer W is placed is disposed in the chamber 11. In the substrate processing apparatus 10, the inner side wall of the chamber 11 and a side surface of the susceptor 12 define therebetween an side exhaust passage 13 functioning as a flow path for discharging gas above the susceptor 12 out of the chamber 11. An exhaust plate 14 is disposed in an intermediate portion of the exhaust passage 13.

The exhaust plate 14 is formed by a plate member formed with numerous holes, and functions as a partition plate for dividing the interior of the chamber 11 into an upper part and a lower part. Plasma is generated in the upper one (hereinafter referred to as "the reaction chamber") 17 of the parts into which the chamber 11 is partitioned by the exhaust plate 14. An evacuation pipe 16 for discharging gas in the chamber 11 is connected to the lower part (hereinafter referred to as "the evacuation chamber (manifold)") 18 of the chamber 11. The exhaust plate 14 catches or reflects plasma generated in the reaction chamber 17 to thereby prevent leakage of the plasma into the manifold 18.

A TMP (Turbo Molecular Pump) and a DP (Dry Pump) are connected to the evacuation pipe 16, and these pumps decompress the interior of the chamber 11 to a vacuum state. More specifically, the DP decompresses the interior of the chamber 11 from atmospheric pressure to an intermediate vacuum state (e.g. $1.3 \times 10$ Pa (0.1 Torr) or lower), while the TMP is cooperatively used with the DP to decompress the interior of the chamber 11 to a high vacuum state (e.g. $1.3 \times 10^{-3}$ Pa ($1.0 \times 10^{-5}$ Torr) or lower) lower than the intermediate vacuum state. It should be noted that the pressure in the chamber 11 is controlled by an APC valve (not shown).

A lower radio frequency power source 19 is connected to the susceptor 12 in the chamber 11 via a lower matcher 20, and the lower radio frequency power source 19 supplies predetermined high-frequency electrical power to the susceptor 12. Thus, the susceptor 12 functions as a lower electrode. The lower matcher 20 reduces reflection of the high frequency electrical power from the susceptor 12 so as to maximize the efficiency of the supply of the radio frequency electrical power into the susceptor 12.

Disposed above the susceptor 12 is an electrostatic chuck 22 having an electrostatic electrode plate 21 therein. The electrostatic chuck 22 is formed by placing an upper disk-shaped member, which has a smaller diameter than a lower disk-shaped member having a certain diameter, over the lower disk-shaped member. It should be noted that the electrostatic chuck 22 is made of ceramic. When the wafer W is placed on the susceptor 12, the wafer W is disposed on the upper disk-shaped member of the electrostatic chuck 22.

A DC power supply 23 is electrically connected to the electrostatic electrode plate 21 of the electrostatic chuck 22. When a positive DC voltage is applied to the electrostatic electrode plate 21, a negative potential is generated on a surface (hereinafter referred to as "the rear surface") of the wafer W on the electrostatic chuck 22 side thereof, and therefore a potential difference is created between the electrostatic electrode plate 21 and the rear surface of the wafer W. As a result, the wafer W is held on the upper disk-shaped member of the electrostatic chuck 22 by attraction by a Coulomb force or a Johnsen-Rahbek force generated by the potential difference.

Further, an annular focus ring 24 is mounted on the electrostatic chuck 22 in a manner enclosing the attractedly held wafer W. The focus ring 24, which is formed of e.g. silicon, converges plasma in the reaction chamber 17 toward a front surface of the wafer W to thereby enhance the efficiency of plasma etching.

Inside the susceptor 12 is formed an annular coolant chamber 25 extending e.g. along the circumference of the susceptor 12. A coolant, such as cooling water or a Galden (registered trademark) fluid, at a low temperature is supplied to the coolant chamber 25 for circulation therethrough from a chiller unit, not shown. The susceptor 12 cooled by the low-temperature coolant cools the wafer W and the focus ring 24 via the electrostatic chuck 22.

A plurality of heat transfer gas supply holes 27 are formed in a part (hereinafter referred to as the "holding surface") of the upper surface of the upper disk-shaped member of the electrostatic chuck 22 where the wafer W is held by attraction. The heat transfer gas supply holes 27 are connected to a heat transfer gas supply unit, not shown, via a heat transfer gas supply line 28, and the heat transfer gas supply unit supplies helium (He) gas as a heat transfer gas via the heat transfer gas supply holes 27 into a gap between the holding surface and the rear surface of the wafer W. The helium gas supplied into the gap between the holding surface and the rear surface of the wafer W effectively transfers heat of the wafer W to the electrostatic chuck 22.

A showerhead 29 is disposed in a ceiling of the chamber 11 in a manner opposed to the susceptor 12. An upper radio-frequency power supply 31 is connected to the showerhead 29 via an upper matcher 30, and the upper radio-frequency power supply 31 supplies predetermined radio-frequency power to the shower head 29. Thus, the showerhead 29 functions as an upper electrode. It should be noted that the upper matcher 30 has a function similar to the function of the lower matcher 20 described above.

The showerhead 29 has a ceiling electrode plate 33 having therein a number of gas holes 32, a cooling plate 34 that detachably suspends the ceiling electrode plate 33, and a cover member 35 that covers the cooling plate 34. A buffer chamber 36 is provided inside the cooling plate 34, and a process gas-introducing pipe 37 is connected to the buffer chamber 36. The showerhead 29 supplies a process gas supplied to the buffer chamber 36 through the process gas-introducing pipe 37 to the reaction chamber 17 through the gas holes 32. In the present embodiment, a mixed gas containing $CF_4$ gas ($C_yF_z$ gas) and $N_2$ gas is supplied as the process gas into the reaction chamber 17.

Moreover, the substrate processing apparatus 10 has a heating mechanism, not shown, that heats, for example, a side wall of the chamber 11. The heating mechanism heats, for example, the side wall of the chamber 11.

In the substrate processing apparatus 10, radio-frequency electrical power is supplied to the susceptor 12 and the showerhead 29 to apply high-frequency electrical power to the interior of the reaction chamber 17, whereby the process gas supplied from the showerhead 29 is turned into high-density plasma in the reaction chamber 17 to perform plasma etching on the wafer W.

Operation of the component parts of the substrate processing apparatus 10 described above is controlled by a CPU of a controller, not shown, provided in the substrate processing apparatus 10 in accordance with a program for plasma etching.

Figure 2A:
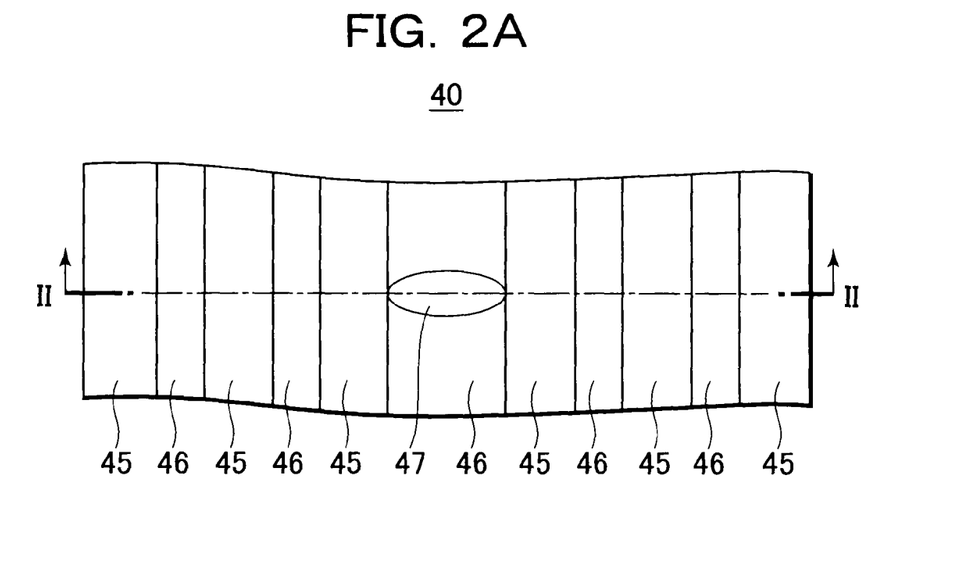
FIG. 2A is a plan view of the semiconductor device.
Figure 2B:
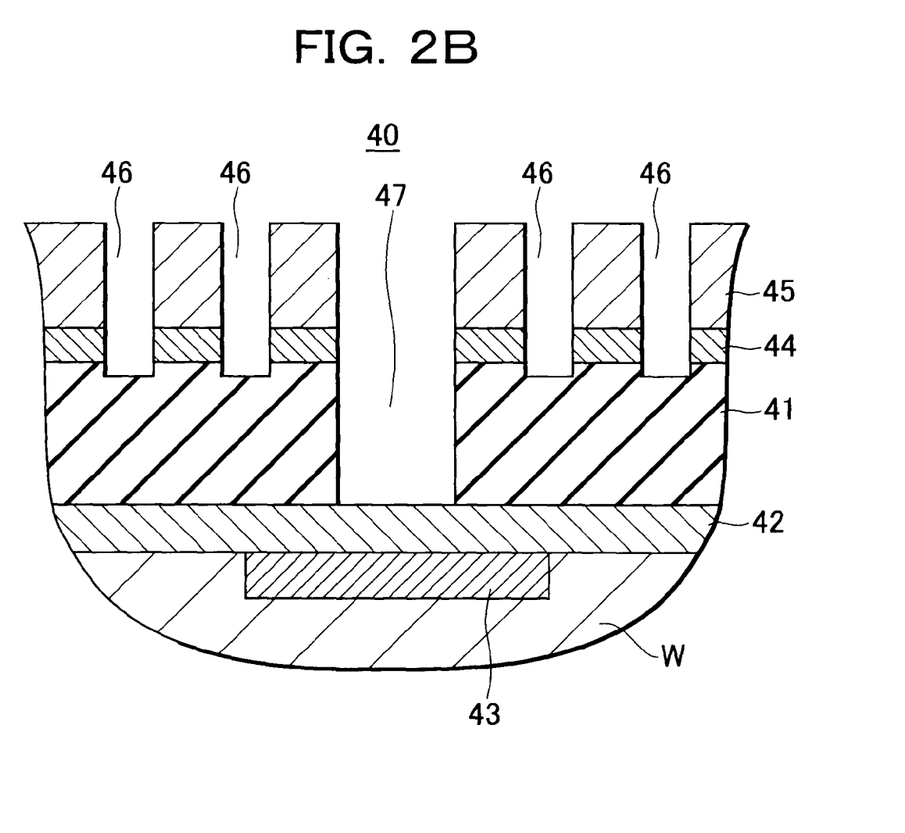
FIG. 2B is a sectional view taken along line II-II in FIG. 2A.

FIGS. 2A and 2B are schematic views of the construction of a semiconductor device formed on a wafer, to which is applied the plasma etching method according to the present embodiment, in which FIG. 2A is a plan view of the semiconductor device, and FIG. 2B is a sectional view taken along line II-II in FIG. 2A.

Referring to FIGS. 2A and 2B, the semiconductor device 40 has a low-dielectric insulating layer 41 comprised of $C_wF_x$ (x and w are predetermined natural numbers) formed on a wafer W, an etching stop layer 42 comprised of SiC formed under the low-dielectric insulating layer 41, copper wiring 43 (metallic layer) covered with the etching stop layer 42, an adhered layer 44 comprised of SiCN formed on the low-dielectric insulating layer 41, and a metal hard mask 45 (metal-containing layer) formed in a predetermined pattern on the adhered layer 44 and containing Ti.

In the semiconductor device 40, relatively shallow trenches 46 and a via hole 47 that passes through the low-dielectric insulating layer 41 are formed in the low-dielectric insulating layer 41. The etching stop layer 42 is exposed from the bottom of the via hole 47, and there is the copper wiring 43 under the etching stop layer 42.

The inventors of the present invention and others etched the etching stop layer 42 using the substrate processing apparatus 10 so as to remove the etching stop layer 42 at the bottom of the vie hole 47.

Figure 3A:
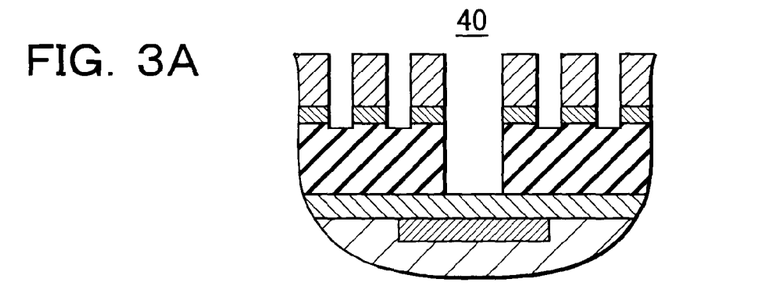
FIGS. 3A to 3D are process diagrams illustrating a process for removing an etching stop layer of the semiconductor device shown in FIGS. 2A and 2B.
Figure 3B:
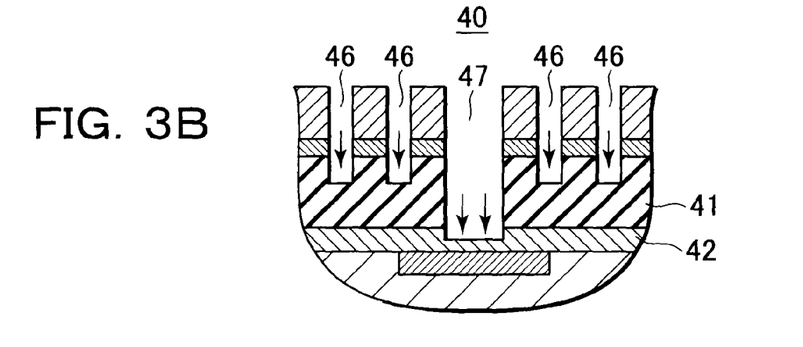

Specifically, first, a wafer W on which the semiconductor device 40 was formed was prepared and loaded into the chamber 11 of the substrate processing apparatus 10, the wafer W was mounted on the susceptor 12 (FIG. 3A), a process gas was supplied into the reaction chamber 17, and plasma was caused to be generated from the process gas. At this time, the generated plasma etched the etching stop layer 42 at the bottom of the vie hole 47 and etched the low-dielectric insulating layer 41 exposed from the bottoms of the trenches 46. As a result, the trenches 46 and the via hole 47 were made to be deeper (FIG. 3B).

Figure 3C:
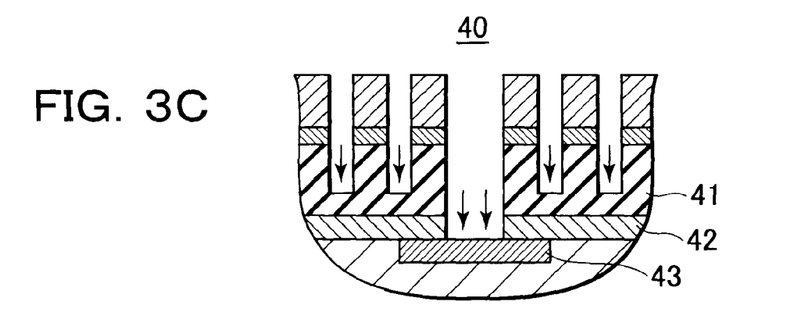
Figure 3D:
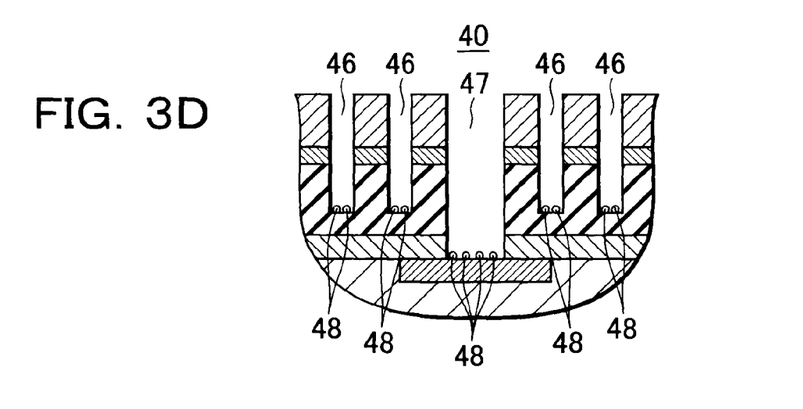

Then, the etching of the etching stop layer 42 and the low-dielectric insulating layer 41 was continued to expose the copper wiring 43 (FIG. 3C), and the etching was further continued. As a result, residues 48 became attached to the bottoms and sides of the via hole 47 and the trenches 46 (FIG. 3D).

The residues 48 became attached to the bottoms and sides of the via hole 47 and the trenches 46 in the case that a single gas comprised of $CF_4$ gas was used as the process gas, and also in the case that a mixed gas comprised of $CF_4$ gas and $N_2$ gas having the same flow rate was used.

On the other hand, even in the case that a porous $SiO_2$ film or the like as a conventional low-dielectric insulation film was etched using plasma generated from $CF_4$ gas, almost no residues were produced in trenches and a via hole.

For the reasons described above, the inventors of the present invention and others focused attention on the fact that although it is difficult to clearly explain the residue generation mechanism, a large amount of C exists in the low-dielectric insulating layer 41 although a large amount of C does not exist in a conventional low-dielectric insulating film, and formulated the hypothesis described below.

(1) In etching of the low-dielectric insulating film 41 at the bottoms of the trenches 46, $C_wF_x$ is decomposed, and a large amount of C disperses. On the other hand, the copper wiring 43 exposed at the bottom of the via hole 47 is sputtered, and Cu (copper) disperses. Further, the metal hard mask 45 is sputtered, and Ti (titan) as well disperses.

(2) The large amount of C and Cu or Ti are bonded together to produce a large amount of reaction product, which then becomes attached as the residues 48 to the bottoms and sides of the via hole 47 and the trenches 46.

(3) On the other hand, in a porous $SiO_2$ film or the like, even if a low-dielectric insulating film is etched, a large amount of C does not disperse, and reaction product resulting from Si (silicon) is generated at most. The reaction product resulting from Si is etched at substantially the same etch rate (the selection ratio of the reaction product resulting from Si to the $SiO_2$ film is approximately 1) as the $SiO_2$ film, but a large amount of fluorine plasma is generated from $CF_4$ gas, and hence almost all of the reaction product resulting from Si is removed. As a result, no residues become attached to the bottoms and sides of the via holes and the trenches.

That is, the inventors and others inferred that the attachment of the residues 48 result from the generation of a large amount of reaction product caused by the dispersion of a large amount of C. Therefore, in the present embodiment, $N_2$ gas having the property of being able to decompose reaction product and a high sputtering capability is supplied so as to facilitate the decomposition and sputtering of reaction product, so that the residues 48 are prevented from becoming attached to the bottoms and sides of the via hole 47 and the trenches 46.

Next, a description will be given of the plasma etching method according to the present embodiment.

FIGS. 4A to 4D are process diagrams illustrating an etching stop layer removing process as the plasma etching method according to the present embodiment.

Figure 4A:
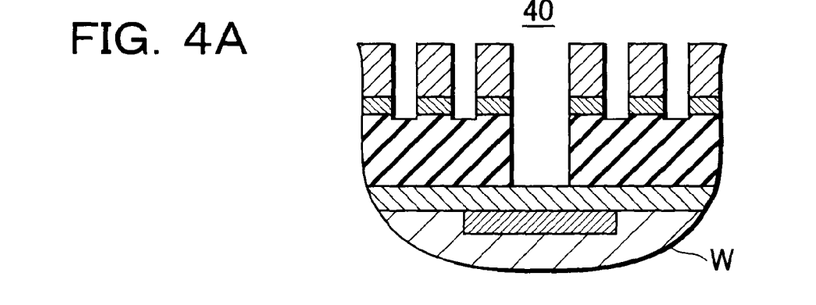
FIGS. 4A to 4D are process diagrams illustrating an etching stop layer removing process as the plasma etching method according to the present embodiment.

First, a wafer W on which the semiconductor device 40 is formed is prepared and loaded into the chamber 11 of the semiconductor apparatus 10, and the wafer W is mounted on the susceptor 12 (FIG. 4A).

Figure 4B:
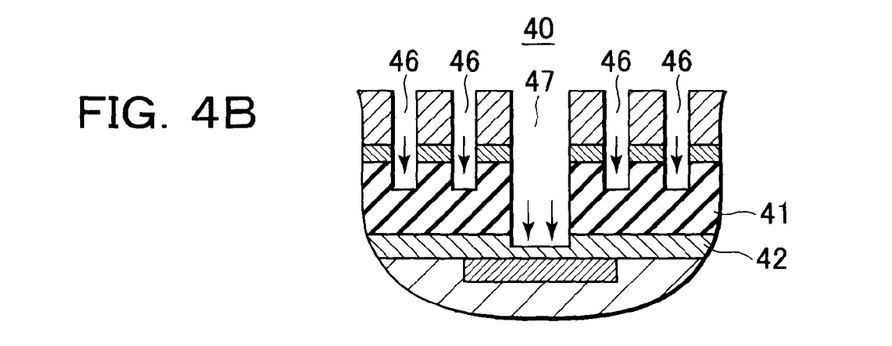
Figure 4C:
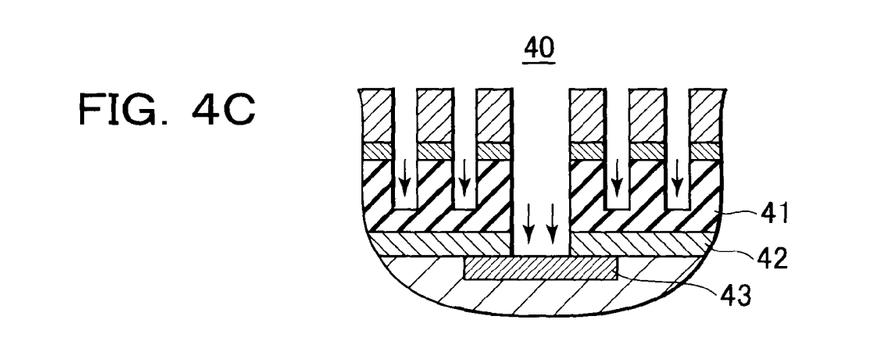

Next, a process gas is supplied to the reaction chamber 17 to generate plasma from the process gas, and the etching stop layer 42 at the bottom of the via hole 47 and the low-dielectric insulating film 41 exposed at the bottoms of the trenches 46 are etched by the plasma. The supplied process gas is a mixed gas in which a flow rate of $N_2$ gas is higher than a flow rate of $CF_4$ gas, and more specifically, the flow ratio of $CF_4$ gas and $N_2$ gas is expressed by $CF_4$ gas:$N_2$ gas=1:X (where X≥7) (FIG. 4B). At this time, both plasma generated from $CF_4$ gas and plasma generated from $N_2$ gas exists, and in particular, a large amount of plasma generated from $N_2$ gas exist, but the etching stop layer 42 and the low-dielectric insulating film 41 are etched mainly by the plasma generated from $CF_4$ gas.

Figure 4D:
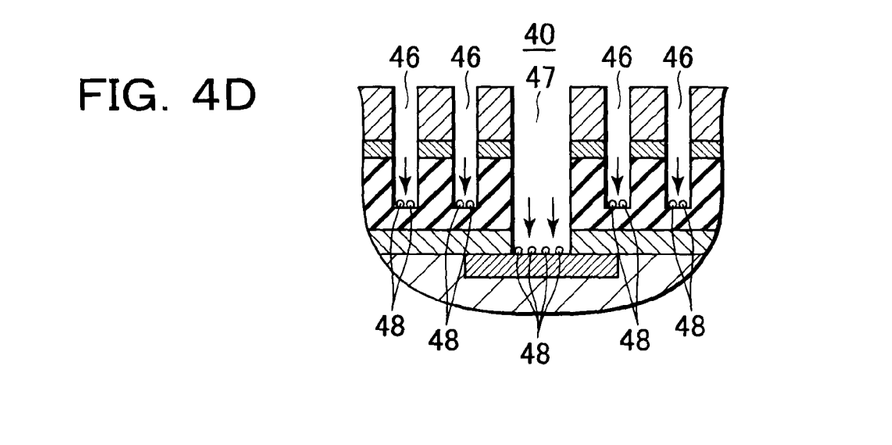

Next, the etching of the etching stop layer 42 and the low-dielectric insulating film 41 is continued to expose the copper wiring 43 (FIG. 4C), and further, the etching is continued for a predetermined time period. At this time, $C_wF_x$ is decomposed in the low-dielectric insulating film 41, a large amount of C disperses, and the copper wiring 43 and the metal hard mask 45 are sputtered, so that Cu and Ti disperse. The large amount of dispersing C and Cu or Ti are bonded together to produce reaction product, but plasma generated from a large amount of existing $N_2$ gas facilitates decomposition of the reaction product and sputters the residues 48 as the reaction product attached to the bottoms and sides of the via hole 47 and the trenches 46 (FIG. 4D).

Then, after a predetermined time period has passed, the present process is brought to an end.

According to the etching stop layer removing process in FIGS. 4A to 4D, the flow rate of $N_2$ gas in the process gas is higher than that of $CF_4$ gas, and more specifically, the flow ratio of $CF_4$ gas and $N_2$ gas in the process gas is expressed by $CF_4$ gas:$N_2$ gas=1:X (where X≥7). The residues 48 are comprised of reaction product of Cu or Ti dispersing from the copper wiring 43 or the metal hard mask 45 and C dispersing from the low-dielectric insulating layer 41, and plasma generated from $N_2$ gas sputters and decomposes reaction product. For the reason described above, there is a large amount of plasma generated from $N_2$ gas, and this facilitates sputtering and decomposition of the residues 48 resulting from the reaction product, so that the residues 48 are prevented from becoming attached to the bottoms and sides of the via hole 47 and the trenches 46.

In the above described semiconductor device 40, because the copper wiring 43 is covered by the etching stop layer 42 formed under the low-dielectric insulating film 41, the copper wiring 43 can be prevented from being inadvertently etched when the low-dielectric insulating film 41 is etched so as to form the via hole 47. Moreover, even if the etching stop layer 42 is removed to expose the copper wiring 43, and Cu flies apart, the residues 48 can be reliably prevented from becoming attached to the bottoms and sides of the via hole 47 and the trenches 46 by applying the etching stop layer removing process in FIGS. 4A to 4D.

Moreover, in the above described semiconductor device 40, because the etching stop layer 42 is an SiC layer, the etching stop layer 42 can be etched by plasma generated from $CF_4$ gas in the process gas, so that the via hole 47 that passes through the etching stop layer 42 can be reliably formed.

Furthermore, in the above described semiconductor device 40, the metal hard mask 45 is a hard mask that is formed in a predetermined pattern on the low-dielectric insulating film 41 and contains Ti. Even if Ti flies apart from the metal hard mask 45 during etching of the low-dielectric insulating film 41 via the metal hard mask 45, the residues 48 can be reliably prevented from becoming attached to the bottoms and sides of the via hole 47 and the trenches 46 by applying the etching stop layer removing process in FIGS. 4A to 4D.

Although in the above described semiconductor device 40, the etching stop layer 42 is formed of SiC, the etching stop layer 42 may be formed of SiCN. In this case, plasma generated from $N_2$ gas facilitates separation of C from SiCN, and as a result, removal of the etching stop layer 42 is facilitated.

In the present embodiment, the etching stop layer 42 is etched, and the low-dielectric insulating film 41 is etched, but depending on the structure of the semiconductor device, there is a case in which the etching stop layer 42 is etched, while the etching of the low-dielectric insulating film 41 is requested to be suppressed, for example, a case in which the via hole 47 should penetrate through the etching stop layer 42, while preventing the trenches 46 from becoming deeper. In such a case, it is preferred that hydrogen-containing gas (such as $CH_3F$ gas, $CH_2F_2$ gas or $CHF_3$ gas) is mixed into the processing gas since plasma generated from the hydrogen containing gas generates deposit. In general, deposit accumulates on the entire surface of a trench having a small aspect ratio (ratio of depth to width) including the bottom portion thereof, but merely accumulates on the vicinity of an opening portion of a via hole having a large aspect ratio and does not accumulate at the bottom of the via hole. Thus, the deposit at the bottom of the trench suppresses sputtering to lower the etch rate of the trench, while sputtering of the bottom of the via hole is not suppressed by the deposit. As a result, the etching stop layer 42 can be passed through the via hole 47, while the trench 46 can be prevented from becoming deep.

Next, a description will be given of a plasma etching method according to a second embodiment of the present invention.

The present embodiment is basically the same as the first embodiment described above in terms of construction and operation, and thus, features of the construction and operation that are the same as in the first embodiment will not be described, only features that are different from those of the first embodiment being described below.

A semiconductor device 50 to which the plasma etching method according to the present embodiment is applied has a low-dielectric insulating film S formed of $C_wF_x$ (x and w are predetermined natural numbers) formed on a wafer W, and a metal hard mask 52 (metal-containing layer) that is formed in a predetermined pattern and contains Ti.

Figure 5A:
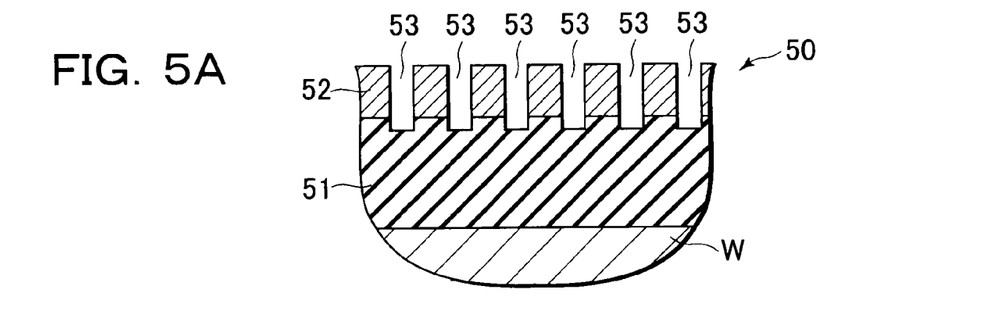
FIGS. 5A to 5D are process diagrams illustrating an interlayer insulation film removing process as the plasma etching method according to a second embodiment of the present invention.

In the semiconductor device 50, relatively shallow trenches 53 are formed in the low-dielectric insulating film 51 by etching or the like before the plasma etching method according to the present embodiment is executed (see FIG. 5A).

FIGS. 5A to 5D are process diagrams illustrating an interlayer insulation film removing process as the plasma etching method according to the present embodiment.

First, a wafer W on which the semiconductor device 50 is formed is prepared and loaded into the chamber 11 of the substrate processing apparatus 10, and the wafer W is mounted on the susceptor 12 (FIG. 5A).

Figure 5B:
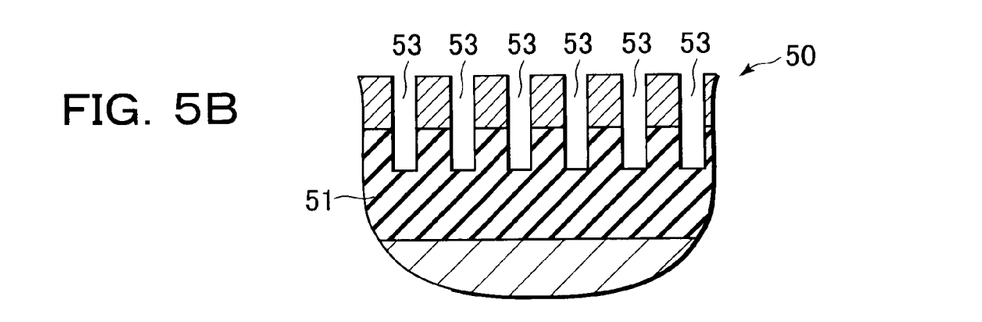

Then, a process gas is supplied into the reaction chamber 17, and plasma is caused to be generated from the process gas. The low-dielectric insulating film 51 exposed at bottoms of trenches 53 is etched by the plasma. The supplied process gas is the same as the process gas in the first embodiment (FIG. 5B). At this time as well, as is the case with the first embodiment, both plasma generated from $CF_4$ gas and plasma generated from $N_2$ gas exist, and in particular, there is a large amount of plasma generated from $N_2$ gas.

Figure 5C:
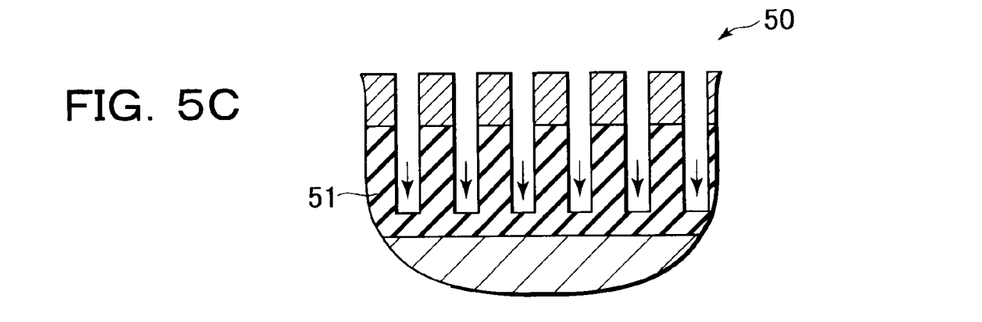
Figure 5D:
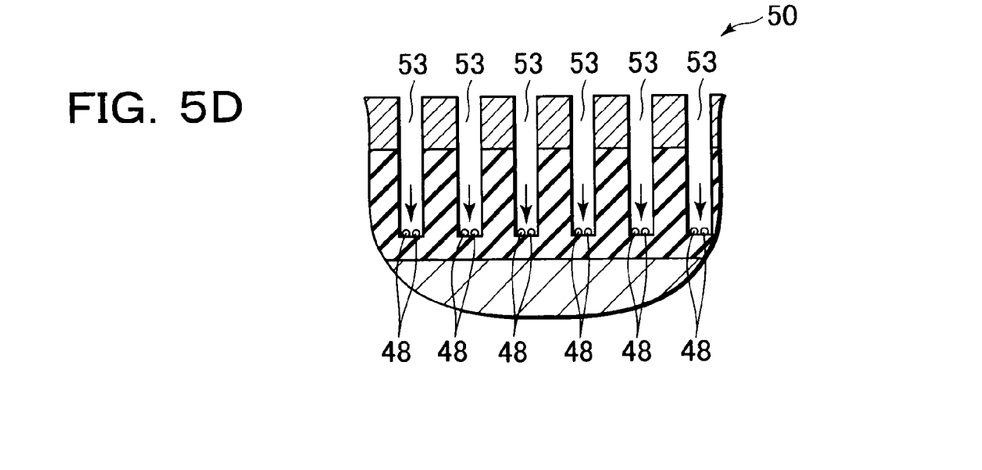

Next, the etching of the low-dielectric insulating film 51 is continued for a predetermined time period (FIG. 5C). At this time, $C_wF_x$ is decomposed in the low-dielectric insulating film 51, so that C disperses, and the metal hard mask 52 is sputtered, so that Ti disperses. The dispersing C and Ti are bonded together to produce reaction product, but plasma generated from a large amount of existing $N_2$ gas facilitates decomposition of the reaction product and sputters residues 48 as the reaction product attached to the bottoms and sides of the trenches 53 (FIG. 5D).

Then, after a predetermined time period has passed, the present process is brought to an end.

According to the interlayer insulation film removing process in FIGS. 5A to 5D, the flow rate of $N_2$ gas in the process gas is higher than that of $CF_4$ gas, and hence there is a large amount of plasma generated from $N_2$ gas. This thus facilitates sputtering and decomposition of the residues 48 resulting from the reaction product. As a result, the residues 48 can be prevented from becoming attached to the bottoms and sides of the trenches 53.

Although in the interlayer insulation film removing process in FIGS. 5A to 5D, $N_2$ gas is supplied so as to facilitate sputtering and decomposition of residues, $O_2$ gas may be supplied instead of $N_2$ gas because the semiconductor device 50 does not have metallic wiring of which predetermined characteristics are deteriorated by oxidization. Plasma generated from $O_2$ gas also facilitates sputtering and decomposition of the residues 48 resulting from the reaction product.

Although the first and second embodiments have been described as the plasma etching methods to which the present invention is applied, plasma etching methods to which the present invention is applied should not be limited to them. For example, the present invention may be applied to plasma etching methods insofar as a low-dielectric insulating film formed of $C_wF_x$ and a metallic layer or a metal-containing layer are exposed to plasma at the same time.

In the above described embodiments, $CF_4$ is used as fluorocarbon-based gas ($C_yF_z$ (y and z are predetermined natural numbers) gas) contained in a process gas, fluorocarbon-based gas contained in a process gas is not limited to this, but may be $C_4F_8$, $C_2F_6$, $C_3F_8$, $C_4F_6$, or $C_5F_8$. The same effects as that of the present invention can be expected to be obtained if $CHF_3$ as hydrogen-containing gas or $NF_3$ or $SF_6$ as non-carbon containing gas is used.

Moreover, in the above described embodiments, it is preferred that the temperature of atmosphere is high when the plasma etching method is executed. If the temperature of atmosphere is high, the dispersion of Cu and Ti from the copper wiring 43 and the metal hard mask 45 (52) is facilitated, so that reattachment of Cu and Ti can be prevented, and also, attachment of C to the side of the via hole 47 or the like can be prevented. As a result, the residues 48 can be reliably prevented from becoming attached to the bottoms and sides of the via hole 47 and the trenches 46.

Further, it is to be understood that the object of the present invention may also be accomplished by supplying a computer with a storage medium in which a program code of software, which realizes the functions of any of the above described embodiments is stored, and causing a CPU of the computer to read out and execute the program code stored in the storage medium.

In this case, the program code itself read from the storage medium realizes the functions of any of the above described embodiments, and hence the program code and the storage medium on which the program code is stored constitute the present invention.

Examples of the storage medium for supplying the program code include a RAM, an NV-RAM, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, and a ROM. Alternatively, the program may be supplied by downloading from another computer, a database, or the like, not shown, connected to the Internet, a commercial network, a local area network, or the like.

Further, it is to be understood that the functions of any of the above described embodiments may be accomplished not only by executing a program code read out by a computer, but also by causing an OS (operating system) or the like which operates on a CPU to perform a part or all of the actual operations based on instructions of the program code.

Further, it is to be understood that the functions of any of the above described embodiments may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

Further, the form of the program code may be an object code, a program code executed by an interpreter, or script data supplied to an OS.

Next, an example of the present invention will be described.

Example

First, the inventors of the present invention prepared a wafer W on which the semiconductor device 40 was formed, and carried out the etching stop layer removing process in FIGS. 4A to 4D on the semiconductor device 40 using the substrate processing apparatus 10. After that, the inventors observed the bottoms and sides of the trenches 46 and the via hole 47, and found that no residues 48 were attached to the bottoms and sides of the trenches 46 and the via hole 47.

Comparative Example

Next, as is the case with the above example, the inventors of the present invention prepared a wafer W on which the semiconductor device 40 was formed, and carried out the etching stop layer removing process on the semiconductor device 40 using the substrate processing apparatus 10. The conditions of the etching stop layer removing process carried out at that time were the same as the conditions of the process in FIGS. 4A to 4D except that a mixed gas in which the flow rates of $CF_4$ gas and $N_2$ gas were equal was used as a process gas. After that, the inventors observed the bottoms and sides of the trenches 46 and the via hole 47, and found that residues 48 were attached to the bottoms and sides of the trenches 46 and the via hole 47.

As a result, it was found that if the flow rate of $N_2$ gas in the process gas is higher at least than the flow rate of $CF_4$ gas when the low-dielectric insulating layer 41 formed of $C_wF_x$ and the metallic layer (the copper wiring 43) or the metal-containing layer (the metal hard mask 45) were exposed at the same time to plasma generated from the process gas, there is the possibility that the residues 48 can be prevented from becoming attached to the bottoms and sides of the trenches 46 and the via hole 47. If the ratio of the flow rate of $CF_4$ gas to the flow rate of $N_2$ gas in the process gas is set in accordance with the following equation, $CF_4$ gas:$N_2$ gas=1:X (where X≥7), the residues 48 can be reliably prevented from becoming attached to the bottoms and sides of the trenches 46 and the via hole 47.

What is claimed is:

1. A plasma etching method for etching a low-dielectric interlayer insulation film, which contains carbon and fluorine, using as a mask a metal hard mask (metal-containing layer) containing Ti formed in a predetermined pattern on a substrate in a chamber, the method comprising:

preparing the substrate in the chamber, the substrate having a metallic layer formed on a surface of the substrate, an etching stop layer on the metallic layer, the low-dielectric interlayer insulation film which contains carbon and fluorine on the etching stop layer, an adhered layer on the low-dielectric interlayer insulation film and the metal hard mask (metal-containing layer) contains Ti on the adhered layer;

introducing a first processing gas into the chamber, the first processing gas including a fluorocarbon-based gas and $N_2$ gas;

generating a first plasma from the first processing gas in the chamber;

etching the low-dielectric interlayer insulation film, using the first plasma and the metal hard mask as a mask, to form a hole in the low-dielectric interlayer insulation film, which contains carbon and fluorine, and to expose the etching stop layer, sputtering, using the first plasma, at a bottom and/or a side surface of the hole the metal hard mask (metal-containing layer) so that metal in the metal hard mask (metal-containing layer) combines with carbon of the low-dielectric interlayer insulation film, which contains carbon and fluorine, to generate a first reaction product (residue);

removing the first reaction product using the first plasma;

generating a second plasma in the chamber from a second processing gas which includes a fluorocarbon-based gas and $N_2$ gas;

etching the exposed etching stop layer, using the second plasma, to expose the metallic layer;

sputtering, using the second plasma, at the bottom and/or the side surface of the hole the metal hard mask (metal-containing layer) and the metallic layer so that metal in the metal hard mask (metal-containing layer) and the metallic layer combine with the carbon of the low-dielectric interlayer insulation film, which contains carbon and fluorine, to generate a second reaction product (residue); and removing the second reaction product using the second plasma continuously after generating the second reaction product, wherein a flow rate of the $N_2$ gas is larger than that of the fluorocarbon-based gas in the first and second processing gases.

2. The plasma etching method as claimed in claim 1, wherein the etching stop layer is comprised of a SiC layer or a SiCN layer.

3. The plasma etching method as claimed in claim 1, wherein the metallic layer is comprised of Cu (copper).

4. The plasma etching method as claimed in claim 1, wherein the fluorocarbon-based gas is at least one selected from a group consisting of $CF_4$ gas, $C_4F_8$ gas, $C_2F_6$ gas, $C_3F_8$ gas, $C_4F_6$ gas and $C_5F_8$ gas.

5. The plasma etching method as claimed in claim 1, wherein the metal hard mask comprises a Ti containing layer.

6. The plasma etching method as claimed in claim 1, wherein the first processing gas, a ratio of the flow rate of the fluorocarbon-based gas and the flow rate of the $N_2$ gas is expressed by the following equation (1):

$$\text{fluorocarbon-based gas}:N_2\text{ gas}=1:X \text{ (where } X \geq 7\text{)} \quad (1).$$

* * * * *